United States Patent
Purser et al.

(10) Patent No.: US 9,029,811 B1
(45) Date of Patent: May 12, 2015

(54) APPARATUS TO CONTROL AN ION BEAM

(71) Applicant: Varian Semiconductor Equipment Associates, Inc., Gloucester, MA (US)

(72) Inventors: Kenneth H. Purser, Gloucester, MA (US); Christopher Campbell, Newburyport, MA (US); Frank Sinclair, Boston, MA (US); Robert C. Lindberg, Rockport, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/163,844

(22) Filed: Jan. 24, 2014

Related U.S. Application Data

(60) Provisional application No. 61/894,069, filed on Oct. 22, 2013.

(51) Int. Cl.
| | | |
|---|---|---|
| *H01J 37/317* | (2006.01) | |
| *H01J 37/14* | (2006.01) | |
| *H01J 37/147* | (2006.01) | |

(52) U.S. Cl.
CPC ........... *H01J 37/1475* (2013.01); *H01J 37/317* (2013.01)

(58) Field of Classification Search
CPC ...................................................... H01J 37/3171
USPC .................. 250/396 R, 396 ML, 492.21
See application file for complete search history.

(56) References Cited

U.S. PATENT DOCUMENTS

| | | | |
|---|---|---|---|
| 4,276,477 A | 6/1981 | Enge | |
| 5,012,104 A | 4/1991 | Young | |
| 5,132,544 A | 7/1992 | Glavish | |
| 5,216,253 A | 6/1993 | Koike | |
| 5,483,077 A | 1/1996 | Glavish | |
| 6,207,963 B1 | 3/2001 | Benveniste | |
| 6,933,507 B2 | 8/2005 | Purser et al. | |
| 7,301,156 B2 | 11/2007 | Purser et al. | |
| 7,525,103 B2 * | 4/2009 | Purser et al. ........... | 250/396 ML |
| 7,807,893 B2 | 10/2010 | Page | |
| 2005/0017199 A1 | 1/2005 | Roh | |
| 2005/0082498 A1 * | 4/2005 | White ....................... | 250/492.21 |

(Continued)

FOREIGN PATENT DOCUMENTS

EP  0473097 A2  3/1992

OTHER PUBLICATIONS

Glavish, et al., "Fast Magnetic Scanning and Ion Optical Features of the New Ibis Oxygen Implanter," Ion Implantation Technology, 1993, vol. 92, p. 397-400.

(Continued)

*Primary Examiner* — Jack Berman
*Assistant Examiner* — Eliza Osenbaugh-Stewart

(57) ABSTRACT

An apparatus to control an ion beam includes a scanner configured in an first state to scan the ion beam wherein the scanner outputs the ion beam as a diverging ion beam; a collimator configured to receive along a side of the collimator the diverging ion beam and to output the diverging ion beam as a collimated ion beam; a beam adjustment component that extends proximate the side of the collimator; and a controller configured to send a first signal when the scanner is in the first state to the beam adjustment component to adjust ion trajectories of the diverging ion beam from a first set of trajectories to a second set of trajectories.

16 Claims, 5 Drawing Sheets

(56) References Cited

U.S. PATENT DOCUMENTS

| | | | |
|---|---|---|---|
| 2007/0125955 | A1 | 6/2007 | Low et al. |
| 2008/0078951 | A1* | 4/2008 | Renau et al. ............. 250/492.21 |
| 2008/0078952 | A1 | 4/2008 | Gupta et al. |
| 2009/0032726 | A1 | 2/2009 | Sieradzki et al. |
| 2009/0084757 | A1 | 4/2009 | Erokhin et al. |
| 2009/0314958 | A1 | 12/2009 | Tieger et al. |
| 2010/0001204 | A1* | 1/2010 | White ........................... 250/398 |
| 2010/0243879 | A1* | 9/2010 | Huang et al. .................. 250/281 |
| 2012/0126147 | A1 | 5/2012 | Cherekdjian |
| 2012/0298854 | A1 | 11/2012 | Hamby et al. |

OTHER PUBLICATIONS

International Search Report and Written Opinion Mailed Jan. 26, 2015 for PCT/US2014/060695 Filed Oct. 15, 2014.

International Search Report and Written Opinion Mailed Jan. 23, 2015 for PCT/US2014/060687 Filed Oct. 15, 2014.

International Search Report and Written Opinion Mailed Jan. 26, 2015 for PCT/US2014/060696 Filed Oct. 15, 2014.

* cited by examiner

APPARATUS TO CONTROL AN ION BEAM

RELATED APPLICATIONS

This application claims priority to U.S. Provisional Patent Application Ser. No. 61/894,069, filed Oct. 22, 2013.

FIELD

The present embodiments relate to ion beam apparatus, and more particularly, to component to control ion beams in beamline ion implanters.

BACKGROUND

In the present day, ion implanters are often constructed to optimize implantation according to a specific set of applications. In current applications, for example, some beamline ion implanters are configured to generate high current ribbon beams in which the beam cross section that intercepts a substrate is defined by a beam width that is much greater than the beam height.

For other ion implantation applications, it may be preferable to use a spot beam ion beam in which the beam height and beam width are more equal. One advantage afforded by spot beam ion implantation is the better control of dose uniformity afforded by spot beams. The local ion dose concentration can be modified by adjusting the speed of the ion beam along the direction of spot beam scanning. This can be accomplished under computer control in a manner that allows the spot beam scanning to be carefully controlled to optimize ion dose uniformity.

In the present day it is common to perform ion implantation using ribbon beams in an ion implanter that is dedicated to ribbon beam implantation and to perform spot beam ion implantation in a dedicated spot beam ion implanter. In part this is because several adjustments to a beamline implanter may be required in present day apparatus in order to switch the same ion implanter between ribbon beam and spot beam operating modes. For one, an ion source may be switched to change the type of ion beam generated. In addition, in order to operate in a spot beam mode, a scanner is employed to scan the spot beam before impinging on the substrate in order for the ion spot beam to cover an entire substrate, which is often much larger in size than the spot beam cross section. However, when an ion implanter is operated in a ribbon beam mode in which the width of the ribbon beam is sufficient to cover a substrate such a scanner is superfluous.

Moreover, in conventional ion implanters the geometry for collimation of a spot beam before reaching a substrate differ from that of a ribbon beam. This is because of the different configuration of beamline components that are employed to provide an ion beam to a collimator. In the case of a ribbon beam, after exiting a mass resolving slit where the ribbon beam is focused, the ribbon beam may diverge from the mass resolving slit until being received by a collimator, which form a collimated ion beam that is directed to the substrate being processed. In the case of a spot beam, after exiting a mass resolving slit the spot beam first enters a scanner that generates an oscillating deflection of the spot beam in order to generate a diverging ion beam envelope before entering the collimator. Accordingly, in a given beamline a collimator that is configured to collimate a ribbon beam may be unsuitable in that configuration for collimating a spot beam. For this reason it is common practice for a ribbon beam ion implanter to be employed for certain ion implantation steps or for certain substrates, such as high dose implantation, while a separate spot beam ion implanter is employed for other ion implantation steps that require better dose control. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus to control an ion beam includes a scanner configured in an first state to scan the ion beam wherein the scanner outputs the ion beam as a diverging ion beam. The apparatus may include a collimator configured to receive along a side of the collimator the diverging ion beam and to output the diverging ion beam as a collimated ion beam; a beam adjustment component that extends proximate the side of the collimator; and a controller configured to send a first signal when the scanner is in the first state to the beam adjustment component to adjust ion trajectories of the diverging ion beam from a first set of trajectories to a second set of trajectories.

In a further embodiment a method a method to control an ion beam includes sending a first signal to activate a scanner configured to scan the ion beam to form a diverging ion beam having a first divergence angle; and sending a second signal to a beam adjustment component to adjust the diverging ion beam to form a second divergence less than the first divergence angle.

DETAILED DESCRIPTION

Figure 1:
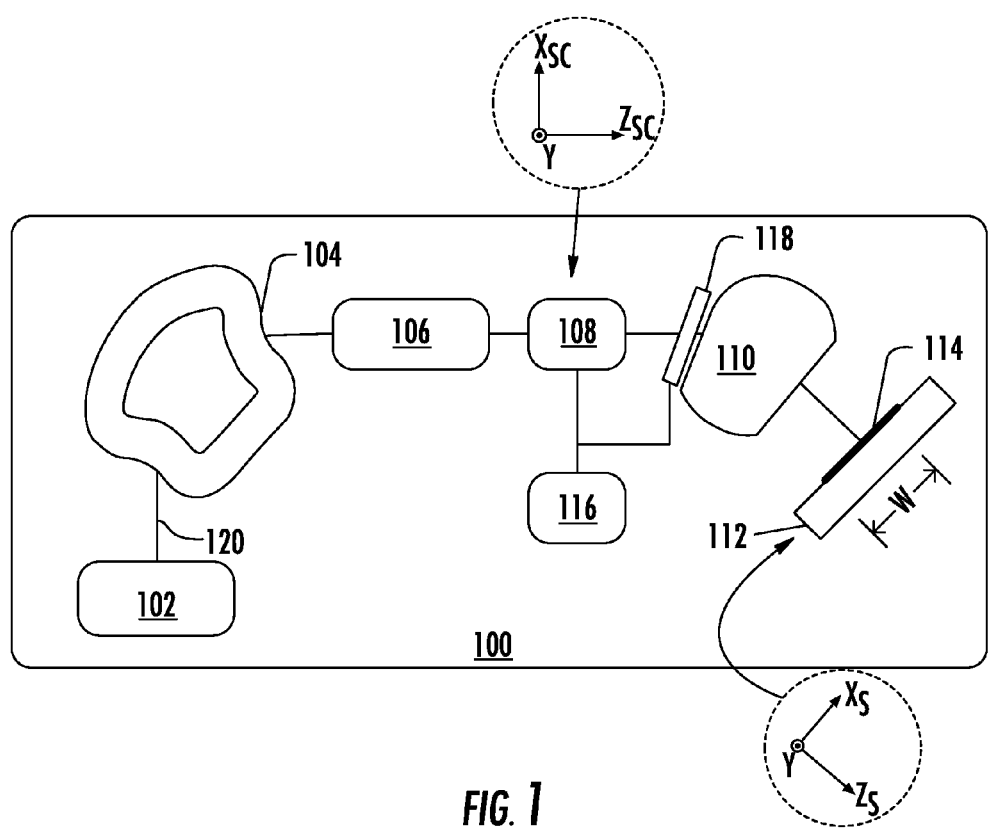
FIG. 1 depicts a top plan view in block form of a ion implanter according to the present embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide an ion implanter having novel set of control elements to control geometry of spot beams. In various embodiments beam adjustment components are provided in or adjacent to a collimator to adjust the angle of scanned spot beams provided to a substrate. The control elements may include control rods, multipole elements, control coils, and other features.

In various embodiments, the ion implanter may be operated in two different modes: a spot beam mode and a ribbon beam mode. In the ribbon beam mode, the collimator may be set to adjust the angles the diverging ribbon beam to form a collimated beam by a main collimator magnet. In addition, other beam adjustment components, such as rods or multipoles may adjust ion beam uniformity of the ribbon beam. As detailed below, in a spot beam mode, the same beam adjustment components associated with a collimator may be adjusted to correct trajectories of the scanned spot beam according to the different geometry of the scanned spot beam as compared to the ribbon beam.

FIG. 1 depicts a top plan view in block form of an ion implanter 100 according to the present embodiments. The ion implanter 100 includes an ion source 102 used to generate ions, analyzer magnet 104, vacuum chamber 106, scanner 108, collimator 110, and substrate stage 112. The ion implanter 100 is configured to generate an ion beam 120 and deliver the ion beam 120 to a substrate 114. For simplicity, the ion beam 120 is depicted merely as a central ray trajectory of the ion beam. In various embodiments, the ion source 102 may be an indirectly heated cathode (IHC) ion source, an RF ion source, a microwave ion source or other ion source. The analyzer magnet 104 may alter the trajectory of ions extracted from the ion source 102 as in conventional analyzer magnets. The vacuum chamber 106 may include a mass resolving slit (not shown in FIG. 1) which may function as a conventional mass resolving slit to screen out ions of undesired mass. In various embodiments the scanner 108 may be a magnetic scanner or an electrostatic scanner. The collimator 110 may be a magnetic collimator to function at least to generate a collimated ion beam to be conducted to the substrate 114. The ion implanter 100 may include other beamline components including apertures, dithering components, acceleration/deceleration lenses, each of whose operation is well known. For clarity, further discussion of such components is omitted herein.

As further illustrated in FIG. 1 the ion implanter 100 includes a collimation controller 116 whose function is at least to adjust trajectories of ions during the collimation process. Further details of operation of the collimation controller 116 are disclosed with respect to the figures to follow. However, in brief, the collimation controller 116 may adjust signals sent to beamline components associated with the collimator 110, such as beam adjustment components discussed below. During ribbon beam mode, signals sent to beam adjustment components may be used to adjust ion beam uniformity of a ribbon beam that is collimated by a magnet of the collimator. During the spot beam mode, the same beam adjustment components may be used to adjust the trajectories of a scanned spot beam.

For convenience in the discussion to follow, different coordinate systems are employed to describe operation of the present embodiments as shown in FIG. 1. At the scanner 108 a first Cartesian coordinate system whose components are labeled Y, Xsc, and Zsc, is used. At the substrate 114 a second Cartesian coordinate system whose components are labeled Y, Xs, and Zs, is used. In each coordinate system, the Y-axis is the same absolute direction. The Z-axis for the different coordinate systems is in each case along the direction of central ray trajectory of ion beam propagation at a particular point. Thus, the absolute direction of the Zsc axis differs from that of Zs. Similarly Xsc differs from Xs.

In some embodiments, the ion implanter 100 may operate in both ribbon beam and spot beam modes. In various embodiments, the ribbon beam may have a relatively smaller aspect ratio defined by a ratio of ion beam height to ion beam width in a plane that is generally perpendicular to the direction of propagation of the ion beam. For a ribbon beam this ratio may be less than one third and is in some examples less than one tenth. For example, a ribbon beam provided to the substrate 114 whose ions have trajectories along the Zs axis may have a width along the Xs axis of about 300 to 400 mm and a height along the Y axis of about 20 mm at the substrate 114. The embodiments are not limited in this context. In various embodiments, the spot beam may have a relatively larger aspect ratio such as greater than ½ and in some cases greater than one. For example, a spot beam provided to the substrate 114 may have a width along the Xs axis of about 20 mm and a height along the Y axis of about 30 mm. The embodiments are not limited in this context. It is to be noted that the aforementioned spot beam dimensions apply to the instantaneous dimension of a spot beam, and that the overall treatment area of a scanned spot beam may be the same or similar to that of a ribbon beam.

Because the ion implanter 100 may operate in either ribbon beam or spot beam mode, the ion implanter 100 provides convenience and process flexibility for processing substrates when a succession of implantation operations for a set of substrates or for different sets of substrates requires different implantation modes. This avoids the requirement to direct substrates to be processed by ribbon beam ion implantation or spot beam ion implantation to a respective ion implanter dedicated for ribbon beam or spot beam implantation.

When a ribbon beam mode is set for the ion implanter 100 a ribbon beam may be generated at the ion source 102 and focused at an MRS (not shown) provided within the vacuum chamber 106. In ribbon beam mode the scanner 108 may remain in a first state, which may be an inactive state, and may transmit the ribbon beam unperturbed. The ribbon beam may then fan out as it propagates into the collimator 110. The collimator 110 and adjacent components may be set to provide collimation to such a ribbon beam. As such the collimator 110 may be set to collimate a diverging beam having a focal plane at the MRS.

In the present embodiments, ion implanter 100 may also be operated in spot beam mode by placing the scanner in a second state, which may be an active state. In the second state the scanner 108 may be active so that a spot beam emerging from the vacuum chamber 106 is scanned by a deflection field oriented along the Xsc axis, such that the ion trajectories fan out over a range of angles before entering the collimator 110. Consistent with the present embodiments, and as detailed below, the collimation controller 116 may generate signals that are sent to the beam adjustment component 118 in a manner that adjusts trajectories of ions entering the collimator 110. This allows the ion implanter 100 to be operated in spot beam mode without having to add extra optical components. Such extra components may be otherwise necessary to adjust for the different location of the scanner and mass resolving slit with respect to the collimator 110, which generate different ion beam envelopes for the respective ribbon beam and spot beam modes.

Figure 2:
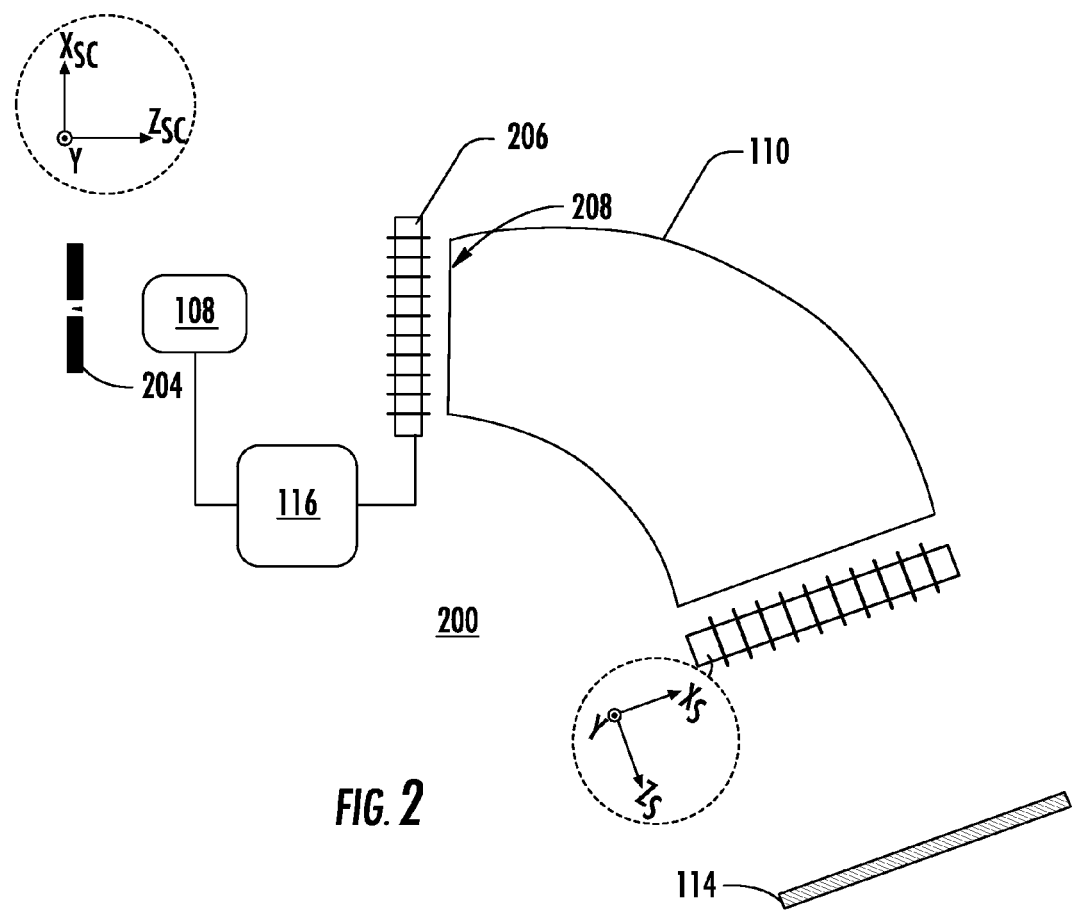
FIG. 2 depicts a top view of an exemplary architecture consistent with various embodiments.

FIG. 2 depicts a top view of an exemplary collimation architecture 200 consistent with various embodiments. In the example shown in FIG. 2 a portion of an ion implanter is shown. As shown in FIG. 2, a mass resolving slit (MRS) 204 is disposed upstream of the scanner 108. In this architecture the scanner 108 is disposed in the beamline in a manner that a ribbon beam or spot beam that exits the mass resolving slit 204 may pass through the scanner 108. In one implementation, the collimator controller 116 may send signals to activate or deactivate the scanner 108 depending upon whether a ribbon beam or spot beam is to pass through the scanner 108.

However, in other scenarios, other beamline devices (not shown) may activate or deactivate the scanner 108.

Figure 3:
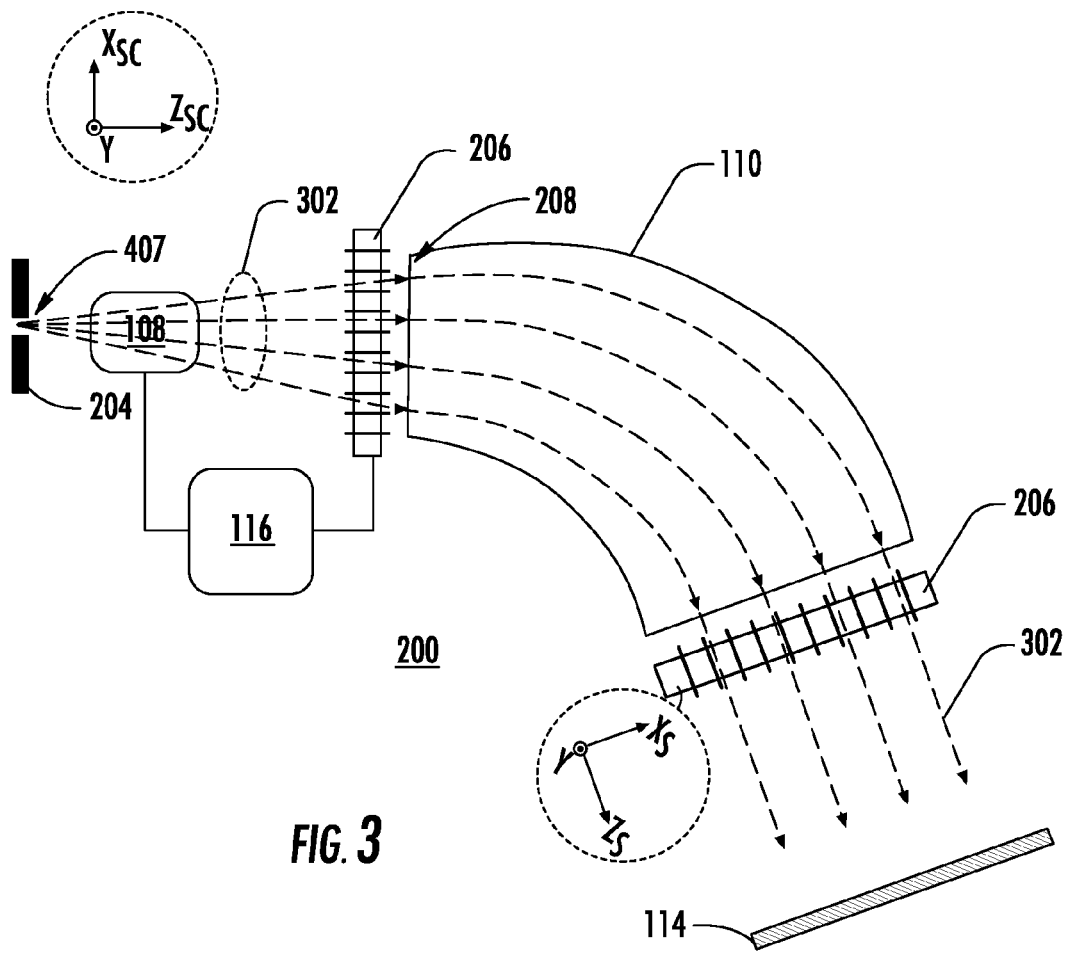
FIG. 3 depicts a ribbon beam implementation of the architecture of FIG. 2.
Figure 4:
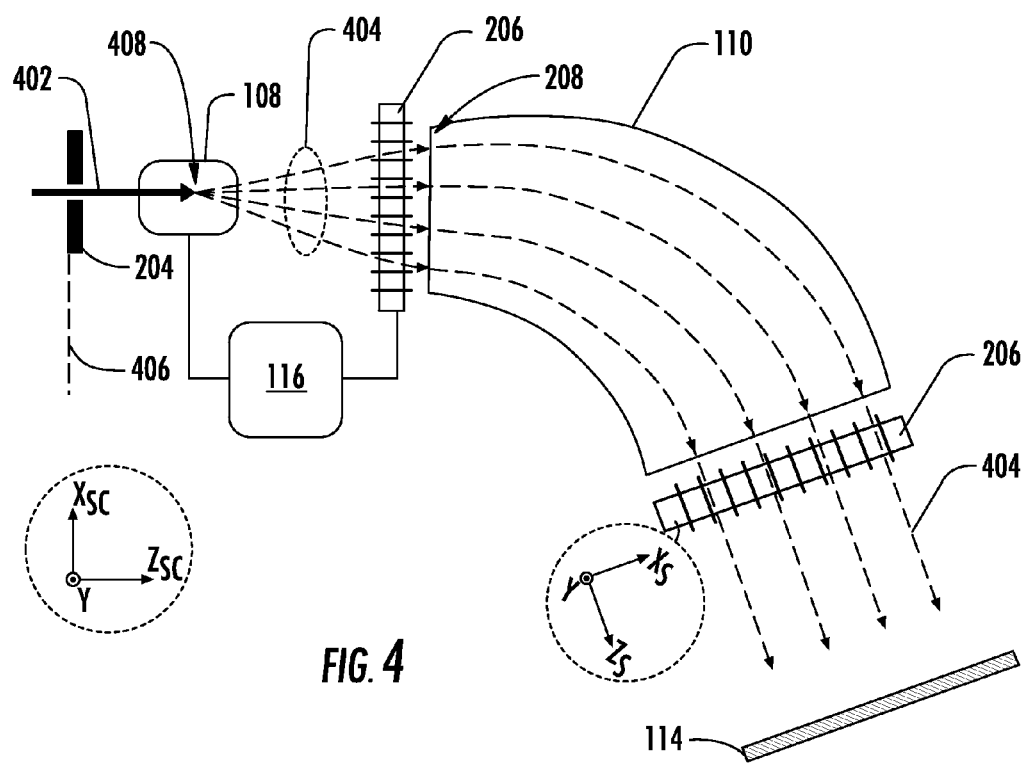
FIG. 4 depicts a spot beam implementation of the architecture of FIG. 2.

As shown in FIG. 2 a beam adjustment component 206 is provided adjacent the collimator 110. In some embodiments, more than one beam adjustment component 206 may be provided, in locations both upstream and downstream with respect to the collimator 110. Referring also briefly to FIGS. 3 and 4, a beam adjustment component 206 extends along the Xsc direction proximate to a side 208 of the collimator that is configured to receive a diverging ion beam. In various embodiments the beam adjustment component 206 may be configured to control ion beam uniformity of a ribbon beam. This may be adjusted by generating a field or fields from the beam adjustment component 206 that locally or selectively deflect ions within a region or regions of the ribbon beam. In one such example, the beam adjustment component may include a pair of steel bars that are each encircled along their axes with multiple current coils that are individually controlled so that varying amounts of current may be supplied in loops that are positioned along the length (Xsc axis) of the beam adjustment component 206 where the direction of current flow in loops may be generally parallel to the Zsc and Y axis as shown in FIG. 2. In this manner local magnetic field variations may be induced at different points along the Xsc axis to selectively deflect ions locally to adjust the ion beam uniformity as the ion beam 202 enters the collimator 110.

FIG. 3 depicts one scenario for operation of the architecture 200. In FIG. 3, the ion implanter is operated in ribbon beam mode such that a ribbon beam 302 passes through the mass resolving slit 204. Although not shown in FIG. 3, the ribbon beam 302 may form a converging beam as it propagates toward the mass resolving slit 204 from the ion source 102. The ribbon beam 302 may converge to form a source at the mass resolving slit 204 and subsequently diverge from the mass resolving slit 204 as it propagates to the collimator 110 as shown. In this scenario a scanner 108 is disposed in the beamline downstream to the mass resolving slit 204 such that the ribbon beam 302 passes through the scanner 108. The scanner 108 may be positioned so as not to block ions that form a diverging beam from the mass resolving slit 204. Moreover, because the scanner 108 is not active, the trajectories of the ions of ribbon beam 302 may pass through the scanner 108 unaltered by the scanner 108. The ribbon beam 302 thus propagates from the scanner 108 as a diverging beam that is intercepted by the collimator 110. As a result, in the ribbon beam mode the collimator 110 may be set to collimate the ribbon beam 302 based upon a first source location 407 at the mass resolving slit 204 as if the scanner 108 were not present.

FIG. 4 depicts another scenario in which the architecture 200 is operated in a spot beam mode. In this example, a spot beam 402 passes through the mass resolving slit 204 and enters the scanner 108. The scanner 108 is activated by collimator controller 116 so that the spot beam 402 is scanned as it passes through. In different embodiments, the scanner 108 may be an electrostatic scanner or a magnetic scanner. In any of these embodiments the scanner 108 may generate an oscillating deflecting field that is applied to the spot beam 402 as it travels through the scanner 108 with an initial direction of propagation parallel to the Zsc axis. In order to deflect the spot beam 402 the deflecting field (not shown) may be applied perpendicularly to the Zsc axis, in a back and forth manner along directions parallel to the Xsc axis.

This results in the generation of a set of diverging trajectories of ion beams that are directed to the collimator 110 from a second source location 408 positioned within the scanner 108 as the spot beam 402 is scanned. Over time, the spot beam 402 forms a diverging ion beam that has an ion beam envelope 404 as shown. In this scenario the ions of the spot beam 402 fan out from the second source location 408 within the scanner 108. This second source location 408 is downstream of the plane 406 of the mass resolving slit 204 that contains the first source location 407. Because of this, the trajectories of ions in the ion beam envelope 404 that enter the collimator 110 are different than those of the ribbon beam 302, which emerges from the mass resolving slit 204. In this scenario, the collimator controller 116 sends signals to the beam adjustment component 206 to adjust the angles of the trajectories of ions within the ion beam envelope 404 as the ions enter into the collimator 110.

Figure 5A:
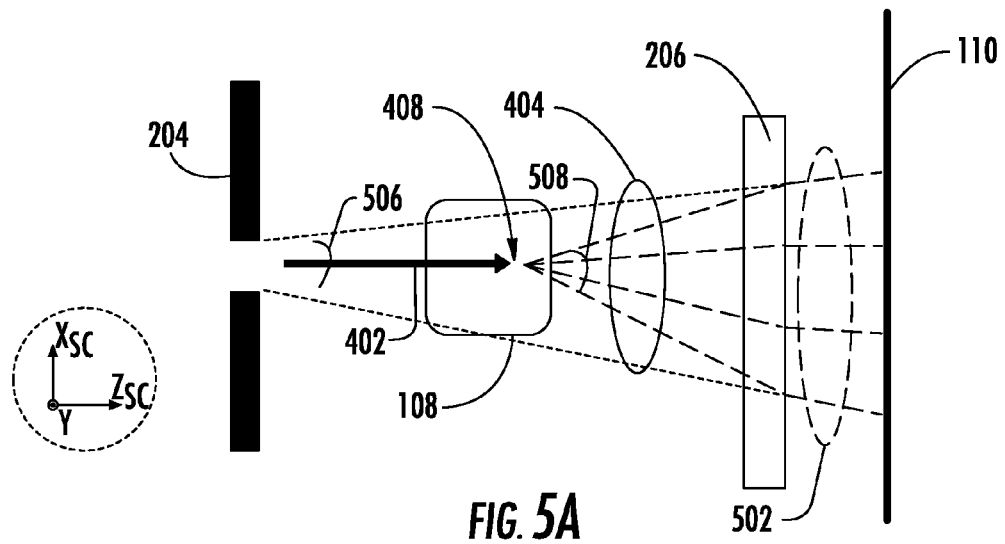
FIGS. 5A and 5B depicts details of the scenario of FIG. 4 from two different perspectives.
Figure 5B:
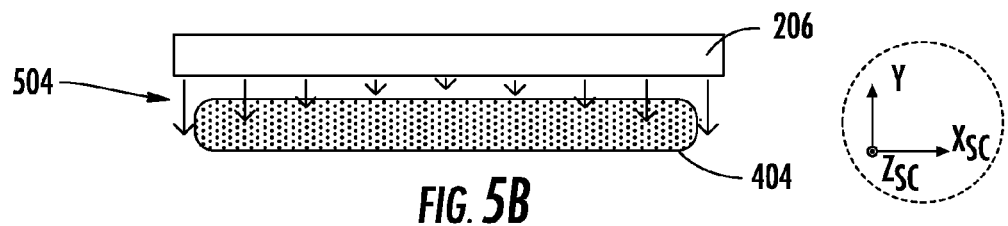

FIGS. 5A and 5B depict details of the ion beam geometry proximate the collimator 110 for the scenario of FIG. 4. As illustrated in FIG. 5A, the ion beam envelope 404 may be more divergent than the trajectories of adjusted ion beam envelope 502 that enter the collimator 110. In particular, a divergence angle 508 of the ion beam envelope 404 is larger than a divergence angle 506 defined by the adjusted ion beam envelope 502 as shown by the dotted lines. Thus, the adjusted ion beam envelope 502 may be said to be more convergent that the ion beam envelope 404 that exists before passing proximate the beam adjustment component 206.

Notably, the trajectories of adjusted ion beam envelope 502 may more closely match trajectories of ions of a ribbon beam than the trajectories of the ion beam envelope 404, and the divergence angle 506 of the adjusted ion beam envelope 502 may more closely match that of a ribbon beam discussed below with respect to FIG. 6. To accomplish this, as shown in FIG. 5B, the intensity of a field 504 may be varied along the length of the beam adjustment component 206. In the view of FIG. 5B the perspective is facing downstream toward the collimator 110 (not shown). As the ion beam envelope 404 passes proximate the beam adjustment component 206 the ion beam envelope 404 experiences a varying field strength of the field(s) 504, as indicated by the size of the arrows representing the field. Notably, this field 504 may have the effect of deflecting the ions of ion beam envelope 404 in the direction parallel to the Xsc axis. In the example of FIG. 5B, the strength of the field(s) 504 may be systematically increased by the beam adjustment component 206 from its center to periphery on either end in order to generate larger deflection for ion trajectories on the outside of the ion beam envelope 404. When received by a collimator 110, the resulting adjusted ion beam envelope 502 may be more similar in shape and size to that of ribbon beam 302 that the ion beam envelope 404, rendering collimation of the ion beam envelope 502 simpler.

Figure 6:
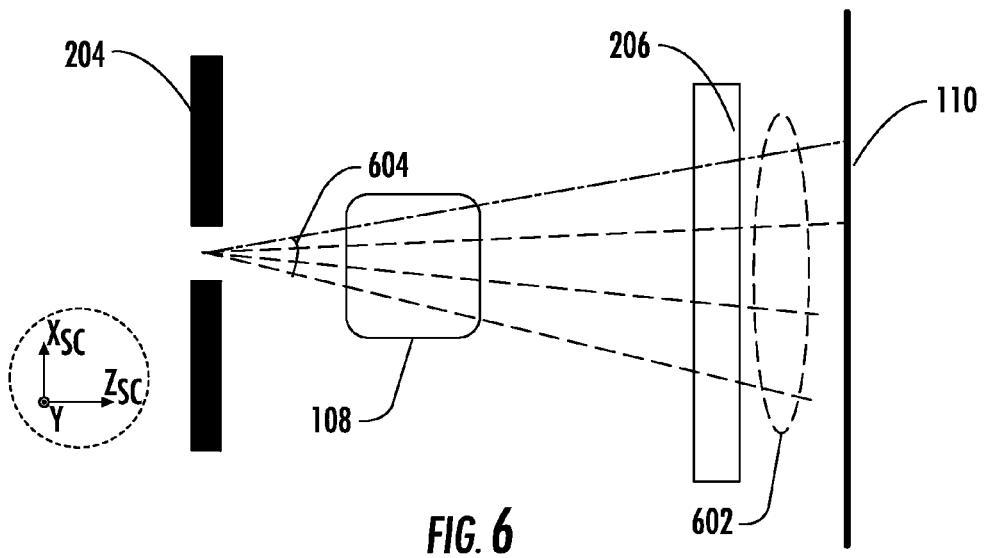
FIG. 6 depicts details of the scenario of FIG. 3.

FIG. 6 depicts details of the ion beam geometry proximate the collimator 110 for the scenario of FIG. 3. As illustrated, the diverging ribbon beam 602 has trajectories that originate from the mass resolving slit 204 and define a divergence angle 604. In the ribbon beam mode, the beam adjustment component 206 may be reconfigured to adjust beam uniformity of the ribbon beam 602, but not to alter the trajectories in the manner performed in FIG. 5 for the spot beam 402. These trajectories of ribbon beam 602 may therefore more closely match the trajectories of adjusted ion beam envelope 502 after the ions that form the ion beam envelope 404 are altered by the beam adjustment component 206, and the divergence angle 604 may more closely match the divergence angle 506 than the divergence angle 508. In particular, in order to adjust beam uniformity local fields may be adjusted at at least one location along the Xsc direction by the beam adjustment component 206. However, this may not be performed in a manner to systematically alter ion beam trajectories to affect divergence angle as describe above with respect to FIGS. 5A, 5B.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An apparatus to control an ion beam, comprising:
a scanner configured in a first state to scan the ion beam wherein the scanner outputs the ion beam as a diverging ion beam having a first divergence angle and configured in a second state to transmit the ion beam as a ribbon beam having a set of ribbon beam trajectories that define a second divergence angle without scanning the ion beam;
a collimator configured to receive along a side of the collimator the diverging ion beam and to output the diverging ion beam as a collimated ion beam;
a beam adjustment component that extends proximate the side of the collimator, the beam adjustment component comprising a plurality of current coils that are positioned along a length of the beam adjustment component; and
a controller configured to send a first signal when the scanner is in the first state to the beam adjustment component to adjust ion trajectories of the diverging ion beam from a first set of trajectories to a second set of trajectories that define a third divergence angle, wherein the second set of trajectories more closely matches the ribbon beam trajectories than the first set of trajectories, wherein the third divergence angle more closely matches the second divergence angle than the first divergence angle.

2. The apparatus of claim 1, wherein the beam adjustment component is configured to adjust a plurality of magnetic fields in a plurality of respective locations proximate the diverging ion beam when the scanner is in the first state, wherein an intensity of the plurality of magnetic fields increases from a center of the beam adjustment component to a periphery on either end of the beam adjustment component.

3. The apparatus of claim 1, wherein in the first state the scanner is configured to receive a spot beam and generate the diverging ion beam as a first diverging ion beam having the first divergence angle that defines a first source at a first source location and wherein in the second state the scanner is configured to transmit the ribbon beam as a second diverging ion beam having the second divergence angle and defining a second source at a second source location upstream to the first source location.

4. The apparatus of claim 1 wherein the collimator is a magnetic collimator.

5. The apparatus of claim 1, wherein the beam adjustment component is operative to adjust beam uniformity in ribbon beam mode by adjusting at least one magnetic field at a location proximate the diverging ion beam when the scanner is in the second state.

6. An ion implanter, comprising:
an ion source to generate an ion beam;
a scanner to transmit the ion beam as a diverging ion beam when in a spot beam mode having a first divergence angle and configured in a ribbon beam mode to transmit the ion beam as a ribbon beam having a set of ribbon beam trajectories that define a second divergence angle without scanning the ion beam;
a collimator to receive the diverging ion beam on a side of the collimator and to output the diverging ion beam as a collimated ion beam;
a beam adjustment component that extends proximate the side of the collimator, the beam adjustment component comprising a plurality of current coils that are positioned along a length of the beam adjustment component; and
a controller configured to send a signal to the beam adjustment component to adjust ion trajectories of the diverging ion beam from a first set of trajectories to a second set of trajectories when the operating mode is the spot beam mode that define a third divergence angle, wherein the second set of trajectories more closely matches the ribbon beam trajectories than the first set of trajectories, wherein the third divergence angle more closely matches the second divergence angle than the first divergence angle.

7. The ion implanter of claim 6, wherein the controller is configured to activate the scanner in the spot beam mode and deactivate the scanner in the ribbon beam mode.

8. The ion implanter of claim 6, wherein the scanner is configured to receive the ion beam as a spot beam and to output the ion beam to the collimator as a first diverging beam in the spot beam mode, and wherein in the spot beam mode the beam adjustment component is configured to increase an intensity of the plurality of magnetic fields from a center of the beam adjustment component to a periphery on either end of the beam adjustment component.

9. The ion implanter of claim 8, wherein the scanner is configured to transmit the ion beam without deflection in the ribbon beam mode, wherein the ion beam is output from the scanner to the collimator as a second diverging ion beam.

10. The ion implanter of claim 9, further comprising a mass resolving slit, wherein in the spot beam mode the first diverging beam defines a first source location in the scanner, and wherein in the ribbon beam mode the second diverging beam defines a second source location at the mass resolving slit.

11. The ion implanter of claim 6, wherein the second set of trajectories are more convergent than the first set of trajectories.

12. The ion implanter of claim 6, wherein the beam adjustment component is operative to adjust beam uniformity in ribbon beam mode by adjusting at least one magnetic field at a location proximate the diverging ion beam.

13. A method to control an ion beam, comprising:
sending a first signal to activate a scanner to scan the ion beam when the ion beam is received by the scanner as a spot beam, in order to form a diverging ion beam having a first divergence angle;
sending a second signal to a beam adjustment component to adjust the diverging ion beam to form a second divergence angle less than the first divergence angle, wherein the beam adjustment component comprising a plurality of current coils that are positioned along a length of the beam adjustment component;

sending a third signal to deactivate scanning when the ion beam is received by the scanner as a ribbon beam, wherein the ion beam is transmitted through the scanner as a ribbon beam having a set of ribbon beam trajectories having a third divergence angle without scanning the ion beam;

wherein the first divergence angle comprises a first set of trajectories and the second divergence angle comprises a second set of trajectories, wherein the second set of trajectories more closely matches the ribbon beam trajectories than the first set of trajectories wherein the third divergence angle more closely matches the second divergence angle than the first divergence angle.

14. The method of claim 13, wherein the sending the second signal comprises sending a signal to adjust a plurality of magnetic fields along the beam adjustment component.

15. The method of claim 13, further comprising:
measuring a beam uniformity of the ion beam proximate the beam adjustment component when scanning is deactivated; and
sending a fourth signal to the beam adjustment component to adjust at least one magnetic field along the beam adjustment component to improve the beam uniformity.

16. The method of claim 13 further comprising collimating the diverging ion beam when the diverging ion beam has the second divergence angle.

* * * * *